(12) United States Patent
Rupp

(10) Patent No.: US 11,119,999 B2
(45) Date of Patent: Sep. 14, 2021

(54) ZERO-OVERHEAD HASH FILTERS

(71) Applicant: SAP SE, Walldort (DE)

(72) Inventor: Martin Rupp, Walldort (DE)

(73) Assignee: SAP SE, Walldorf (DE)

( * ) Notice: Subject to any disclaimer, the term of this patent is extended or adjusted under 35 U.S.C. 154(b) by 89 days.

(21) Appl. No.: 16/520,803

(22) Filed: Jul. 24, 2019

(65) Prior Publication Data

US 2021/0026828 A1    Jan. 28, 2021

(51) Int. Cl.
| | | |
|---|---|---|
| *G06F 16/00* | (2019.01) | |
| *G06F 16/22* | (2019.01) | |
| *G06F 16/9035* | (2019.01) | |
| *H03K 19/21* | (2006.01) | |
| *H03M 7/30* | (2006.01) | |
| *H03M 7/40* | (2006.01) | |

(52) U.S. Cl.
CPC ........ *G06F 16/2272* (2019.01); *G06F 16/221* (2019.01); *G06F 16/9035* (2019.01); *H03K 19/21* (2013.01); *H03M 7/3084* (2013.01); *H03M 7/40* (2013.01)

(58) Field of Classification Search
CPC ............... G06F 16/2246; G06F 16/258; G06F 16/8373; G06F 16/313; G06F 40/295; G06F 16/3344; G06F 40/00; G06F 40/55; G06F 40/205; G06F 16/322; G06F 16/90344; G06F 17/2705; G06F 17/2872; G06F 16/25; G06F 16/22; G06F 16/31; G06F 16/903; G06F 17/27; G06F 17/28; G06F 16/00; G06F 17/00; G06F 17/30; G06F 17/2805; G06F 16/211; G06F 16/2477; G06F 16/283
See application file for complete search history.

(56) References Cited

U.S. PATENT DOCUMENTS

| | | | |
|---|---|---|---|
| 6,047,283 A | 4/2000 | Braun | |
| 6,484,250 B1 | 11/2002 | Mei et al. | |
| 6,845,375 B1 * | 1/2005 | Sinclair | G06F 16/2282 |
| 6,889,225 B2 | 5/2005 | Cheng et al. | |
| 8,275,782 B2 | 9/2012 | Hirsch et al. | |
| 8,321,420 B1 * | 11/2012 | Sinclair | G06F 16/2228 |
| | | | 707/741 |
| 8,924,687 B1 | 12/2014 | Frailong et al. | |
| 9,069,810 B2 | 6/2015 | Kim et al. | |

(Continued)

OTHER PUBLICATIONS

Evan P. Harris et. al.: "Using Optimized Multi-attribute Hash Indexes for Hash Joins" Technical report 93/12, Depart. of Computer Science, Univ. of Melbourne Australia.

(Continued)

*Primary Examiner* — Jean M Corrielus
(74) *Attorney, Agent, or Firm* — Buckley, Maschoff & Talwalkar LLC

(57) ABSTRACT

A system includes determination of a first value of a first row of a database table column, generation of a first truncated value based on the first value, the first truncated value including fewer bytes than the first value, generation of a first representation of the first value based on the first truncated value, the first representation including fewer bytes than the first value, storage of the first representation at a first position in a first array, and storage of the first truncated value at a second position in a second array.

20 Claims, 8 Drawing Sheets

| Name | hash value | reduced string |
|---|---|---|
| Schneider | 1b0c | hneider |
| Baumgartner | 8bec | umgartner |
| Beiermann | 9fd6 | iermann |
| Schmidt-Kaemmerer | 4e40 | hmidt-Kaemmerer |
| Altenberger | d4ab | tenberger |
| Smith | b7ff | ith |
| O'Connor | 7ef0 | Connor |
| Pit | 5579 | t |

(56) References Cited

U.S. PATENT DOCUMENTS

| | | | |
|---|---|---|---|
| 9,805,079 B2 * | 10/2017 | Joshi | G06F 3/04842 |
| 10,019,382 B2 | 7/2018 | Lasperas et al. | |
| 10,346,315 B2 * | 7/2019 | Teotia | G06F 12/128 |
| 10,366,378 B1 * | 7/2019 | Han | G06Q 20/202 |
| 10,783,102 B2 * | 9/2020 | Brown | G06F 13/28 |
| 2003/0074348 A1 * | 4/2003 | Sinclair | G06F 16/2282 |
| 2011/0252033 A1 | 10/2011 | Narang et al. | |
| 2013/0086073 A1 * | 4/2013 | Lyle | G06F 16/2255 |
| | | | 707/747 |
| 2014/0258301 A1 * | 9/2014 | Misra | G06F 40/30 |
| | | | 707/739 |
| 2014/0304275 A1 * | 10/2014 | Baskett | G06F 16/2255 |
| | | | 707/747 |
| 2015/0032684 A1 * | 1/2015 | Gupta | G06F 16/2228 |
| | | | 707/600 |
| 2015/0227414 A1 | 8/2015 | Varma | |
| 2016/0062954 A1 * | 3/2016 | Ruff | G06F 40/205 |
| | | | 715/249 |
| 2019/0311057 A1 * | 10/2019 | Sung | G06F 16/24542 |
| 2019/0347022 A1 * | 11/2019 | Thiel | G06F 3/067 |
| 2020/0004851 A1 * | 1/2020 | Lambov | G06F 16/2255 |

OTHER PUBLICATIONS

Hyeontaek Lim: "Resource-Efficient Data-Intensive System Designs for High Performance and Capacity" School of Computer Science Carnegie Mellon University, Sep. 2015.

\* cited by examiner

ZERO-OVERHEAD HASH FILTERS

BACKGROUND

Database systems typically store large amounts of interrelated data. For example, a Customers database table may include columns such as Customer Id, Name, and Address. Each row of the Customers database table therefore provides data related to a particular customer. A user may wish to determine whether a particular customer name is stored in the Name column of the Customers table and, if so, to determine the "row id" of the table row(s) in which the particular customer name is stored. The row id allows access to the values of the other columns (e.g., Customer Id, Address) of the associated row.

In one example, every stored value of a particular column is checked in order to determine whether a particular customer name is stored in the column. This process requires accessing the entirety of each stored value. More efficient approaches include storing the column values in a sorted order and executing a "binary search" algorithm, and storing the column values in some other search structure such as a (balanced) binary tree.

Traditional inverted indices are separate data structures which associate each data value of a column with one or more row ids, enabling fast determination of the rows in which a particular column value is present. However, a traditional index requires significant memory overhead in addition to the memory required to store the column values. A traditional index also requires significant processing resources in order to respond to an addition or modification of column values.

Approaches for accessing database column values are desired which provide a suitable combination of speed and resource utilization.

DETAILED DESCRIPTION

The following description is provided to enable any person in the art to make and use the described embodiments and sets forth the best mode contemplated for carrying out some embodiments. Various modifications, however, will be readily-apparent to those in the art.

Some embodiments relate to storage of a first list of reduced-size representations which represent values of a column, and a second list of truncated column values. Due to its reduced size, the first list can be scanned quickly to determine whether a particular value does not exist or may exist in the column. If it is determined that the value may exist, the second list of values is used to determine whether the value exists and to determine the row id(s) corresponding to the value. According to some embodiments, storage of the lists of reduced-size representations and truncated column values requires no more memory than storage of the original column values.

Embodiments may provide faster column searching than systems without an index, without increasing memory overhead. Some embodiments also handle column value updates more efficiently than traditional indices, by requiring modification of only one reduced-size representation and one truncated column value.

In a particular example, each value of a column is represented by a k-byte representation within a first array and, in a second array, by a version of the value which has been truncated by k-bytes. In a simple example, a first four bytes of a column value are stored in the first array and the remaining bytes of the column value are stored in the second array.

Figure 1:
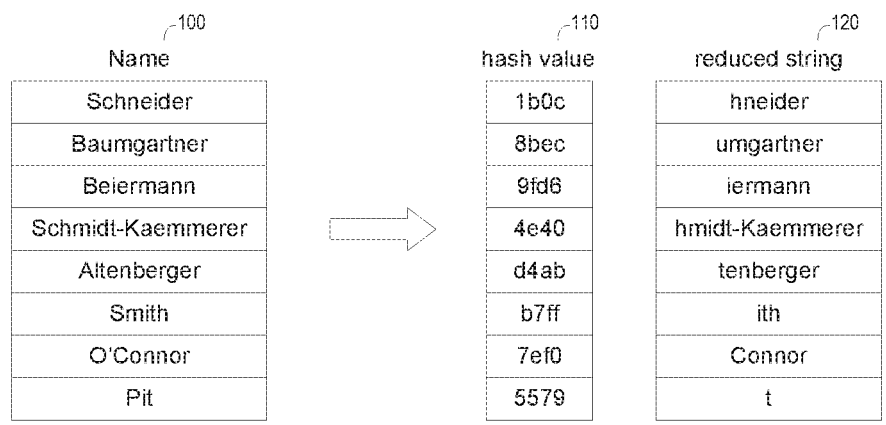
FIG. 1 illustrates representation of a database table column as an array of hash values and an array of reduced strings according to some embodiments.

FIG. 1 illustrates one implementation according to some embodiments. Table column 100 shows values of a Name column of a particular database table. The values are sorted such that each value is indexed to the row of the database table to which it belongs. According to some embodiments, column 100 encoded to and stored as array 110 and array 120.

Column storage as shown in FIG. 1 may be used for any number of columns of a particular database table. In some examples, certain columns of a database table are not indexed (but may simply be stored in sorted order), certain columns of the database table are supported by traditional index structures, and/or certain columns of the database table are stored as shown in FIG. 1.

Array 110 stores a value corresponding to each value of column 100. For example, value "1b0c" corresponds to column value "Schneider" and value "d4ab" corresponds to column value "Altenberger". Generally, each value of array 110 is generated based on its corresponding column value and is limited to k (i.e., k=2) bytes. In the particular example of FIG. 1, each value of array 110 is a hash value which is determined based on its corresponding column value.

Each value of array 120 is generated based on its corresponding column value and is k bytes shorter than its corresponding column value. According to FIG. 1, each value of array 120 is a reduced string generated by truncating the first k bytes from its corresponding column value. Embodiments may use any suitable value of k.

Figure 2:
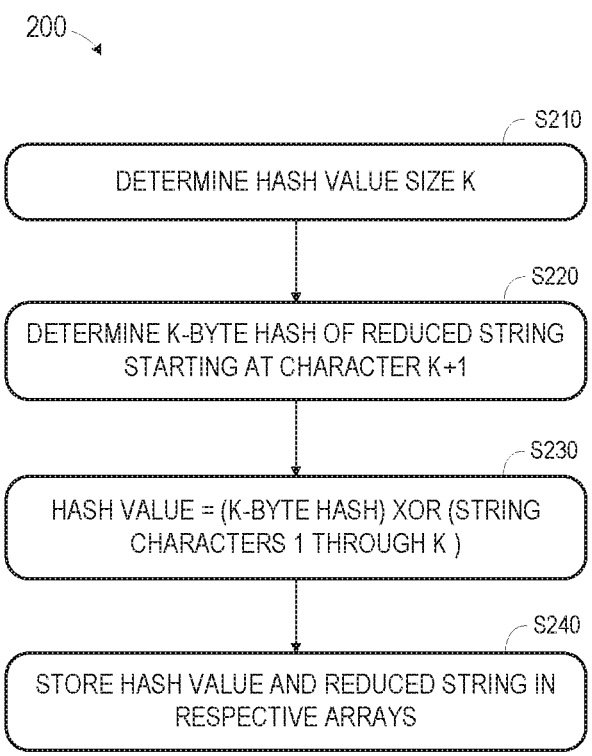
FIG. 2 is a flow diagram of a process to encode a database table column as an array of hash values and an array of reduced strings according to some embodiments.
Figure 3:
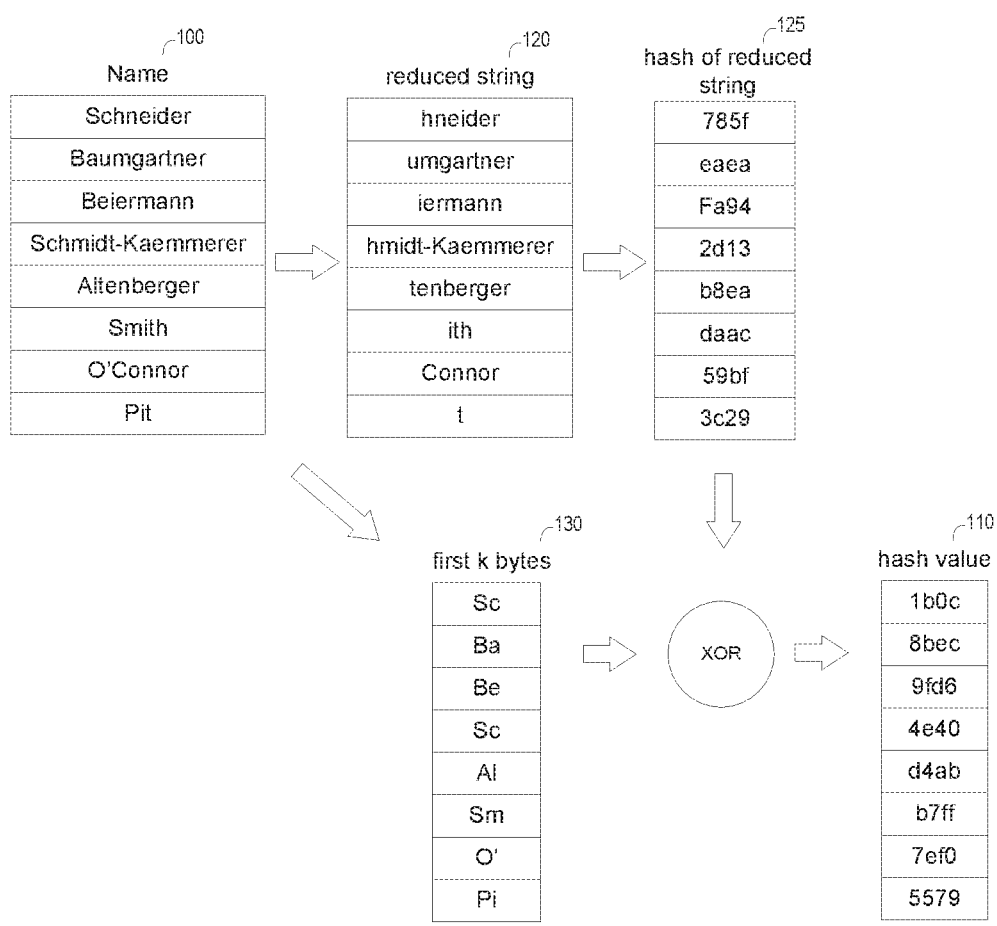
FIG. 3 illustrates encoding of a database table column as an array of hash values and an array of reduced strings according to some embodiments.

FIGS. 2 and 3 illustrate generation of hash values of a first array and reduced strings of a second array based on an array of column values. Embodiments are not limited to the processes illustrated in FIGS. 2 and 3.

FIG. 2 comprises a flow diagram of process 200 according to some embodiments. In some embodiments, various hardware elements of a database execute program code to perform process 200. Process 200 and all other processes mentioned herein may be embodied in computer-executable program code read from one or more of non-transitory computer-readable media, such as a hard disk drive, a volatile or non-volatile random-access memory, a DVD-ROM, a Flash drive, and a magnetic tape, and then stored in a compressed, uncompiled and/or encrypted format. In some embodiments, hard-wired circuitry may be used in place of, or in combination with, program code for implementation of processes according to some embodiments. Embodiments are therefore not limited to any specific combination of hardware and software.

Process 200 is initiated in order to encode a database table column value according to some embodiments. Accordingly, process 200 may be initiated upon execution of a transaction to add or update a value of a column which has been flagged for encoding as described herein.

Initially, at S210, a size k of a hash value is determined. The size k may be specified by metadata defining the table column, for example. At S220, a k-byte hash of a reduced string is determined. In the present example, the reduced string consists of the column value with the first k bytes removed. Given the column value "Schmidt-Kaemmerer" and k=2, the reduced string is "hmidt-Kaemmerer". The 2-byte hash value of the reduced string may be calculated at S220 as hash("hmidt-Kaemmerer")% $(256\char`\^2)=2d13_{16}$. K-byte hash values can be created from any hash function h such that h_{k-byte}(value)=h(value) % $(256\char`\^k)$. FIG. 3 illustrates hashes 125 of reduced strings 120 which are generated during process 200. Hashes 125 are illustrated to describe process 200 and are not necessarily persisted in any memory after generation of corresponding hash values as described below.

A hash value is determined at S230 based on the bytes 1 through k of the column value and the k-byte hash. Continuing the above example, the first 2 byte of Schmidt-Kaemmerer" are "Sc"=$6353_{16}$. FIG. 3 illustrates first k bytes 130 of each value of column 10. FIG. 3 also illustrates an XOR operation between hashes 125 and first k bytes 130 to generate hash values 110. With respect to the present example, $2d13_{16}$ XOR $6353_{16}$=$4e40_{16}$. Accordingly, at S240, hash value $4e40_{16}$ is stored in array 110 at an index corresponding to the row of "Schmidt-Kaemmerer" in column Name 100, and reduced string "hmidt-Kaemmerer" is stored in array 120 at the same row index.

Figure 4:
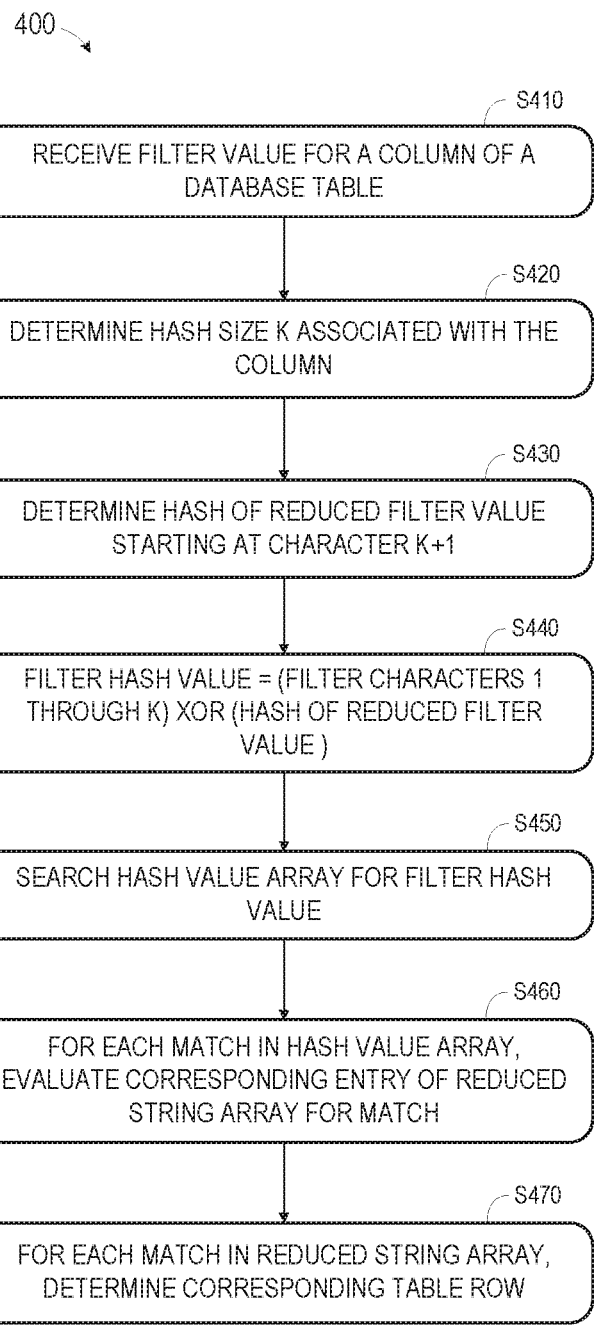
FIG. 4 is a flow diagram of a process to read a database table column represented as an array of hash values and an array of reduced strings according to some embodiments.

FIG. 4 is a flow diagram of process 400 to search for a column value of a column encoded as described herein. The column value may be received as a query filter to select rows of a table which include the column value.

In this regard, a filter value for a column of a database table may be received at S410. The present example will assume a filter value of "Schmidt-Kaemmerer". Next, at S420, a hash size k associated with the column is determined. As mentioned above, this size may be associated with the column and determined through metadata. K=2 is assumed below.

The hash size and the filter value are then used to determine a hash value as described above. At S430, a k-byte hash of a reduced string is determined. Given the filter value "Schmidt-Kaemmerer" and k=2, the reduced string is "hmidt-Kaemmerer" and the 2-byte hash value of the reduced string is $2d13_{16}$. A filter hash value is determined at S440 based on bytes 1 through k of the filter value (i.e., "Sc") and the k-byte hash (i.e., "$2d13_{16}$"). As described above with respect to S230, the resulting filter hash value is $4e40_{16}$.

At S450, the stored hash value array is searched for the filter hash value. For each matching value in the hash value array, a corresponding entry of the reduced string array is evaluated at S460 to determine if it matches the filter value. In the present example, since $4e40_{16}$ matches an entry of array 110, corresponding entry "hmidt-Kaemmerer" of array 120 is evaluated to determine if it matches the filter value "Schmidt-Kaemmerer". Due to potential false positives (e.g., only 65536 different hash values exist for k=2), the original column value is reconstructed from the two entries (e.g., $4e40_{16}$ and "hmidt-Kaemmerer") and compared with the filter value at S460.

As an example of such reconstruction, h=hash("hmidt-Kaemmerer") % $(256\char`\^2)=2d13_{16}$. This result is XOR'd with entry $4e40_{16}$ as $2d13_{16}$ XOR $4e40_{16}$=$6353_{16}$="Sc". This result is prepended that the entry "hmidt-Kaemmerer" to result in "Schmidt-Kaemmerer", which matches the filter value.

A corresponding table row may be determined at S470 for each match. The table row may be used to fetch other column values of the row, if desired. In the present example, the position of the relevant entries of arrays 110 and 120 indicates that the fourth row of the table including Name column 100 includes the filter value "Schmidt-Kaemmerer".

In most database systems which utilize a column store, a column of a table is stored in several separated memory blocks rather than as a single vector. The separated blocks may represent logical partitions on the full rows of the table, e.g., Country-specific partitions of a Customer table. For example, it will be assumed that the first five values of array 120 are stored in a first memory block and the remaining values are stored in a second memory block. Metadata associated with array 110 indicates that the first five entries of array 110 are associated with the first memory block and the remaining entries are associated with the second memory block. During a search for "Smith", a corresponding hash is calculated as described above (=$b7ff_{16}$) and it is determined that this value is stored in an entry of array 110 which is associated with the second memory block. The corresponding reduced string ("ith") is retrieved from the second memory block and the original value Smith is calculated therefrom as described above.

Advantageously, the foregoing example does not require any access to the first memory block storing the first five entries of array 120. According to some embodiments, the blocks of reduced strings are therefore stored in a manner which provides lower bandwidth than prior systems while providing similar performance due to the reduced bandwidth requirements. For example, the blocks of reduced strings may be compressed with compression techniques such as LZW/Huffman encoding which reduces memory overhead but increases processing overhead, and/or may be stored in a file-based storage or a remote network device, which may reduce cost but increase latency.

Figure 5:
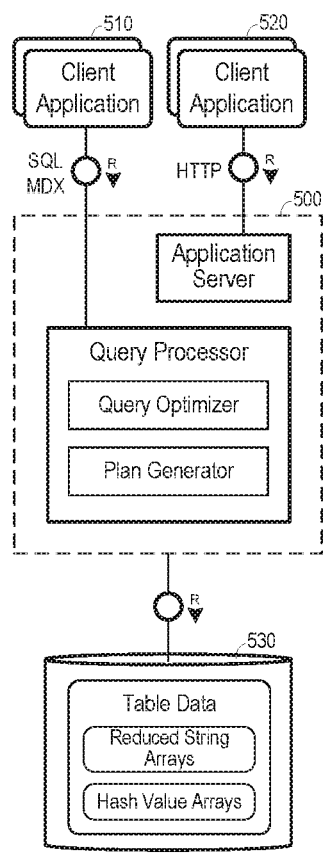
FIG. 5 is a block diagram of a database system using file-based database storage according to some embodiments.

FIG. 5 illustrates database server 500, which may or may not comprise a node in a distributed database system including multiple server nodes. Generally, server 500 may receive a query from client applications 510 or 520 and return results thereto based on data stored within database storage 530.

Server 500 and/or data storage 530 may be cloud-based and components thereof may be implemented using on-demand virtual machines, virtual servers and cloud storage instances. Such cloud-based components may be connected to the Internet and/or to any network or combinations of networks. A cloud can include a wide area network (WAN) such as the public Internet or a private network, and may include a local area network (LAN) within an organization.

Server 500 executes program code to provide an application server and a query processor. The application server provides services for executing server applications. For example, Web applications executing on an application server may receive HyperText Transfer Protocol (HTTP) requests from client applications 520 as shown.

The query processor processes Structured Query Language (SQL) and Multi-Dimensional eXpression (MDX)

statements and may the latter statements directly from client applications 510. The query processor may also include a query optimizer and plan generator for use in determining query execution plans.

Server 500 may include many additional software components providing functionality that is or becomes known. For example, server 500 may include components to perform administrative and management functions. Such functions may include snapshot and backup management, indexing, optimization, garbage collection, and/or any other database functions that are or become known. Server 500 may support multi-tenancy to separately support multiple unrelated clients by providing multiple logical database systems which are programmatically isolated from one another.

Database storage 530 may comprise any file-based storage system that is or becomes known Database storage 530 may include data of database tables as well as metadata describing the structure of the data. Database storage 530 may also include supporting data structures such as indices, including indices composed of a hash value array and a reduced string array as described herein.

In some implementations, the roundtrip time from server 500 to storage 530 can be as large as 300 ms, with a bandwidth of 10-50 MB/s. Overhead for loading data chunks between 1 byte and 256 kb is therefore dominated by roundtrip times. Some embodiments therefore store data in blocks sized between 256 kb-1 MB, and avoid touching and loading blocks if not required. According to some embodiments, an entire hash value array is stored in a single block which is different from the blocks storing the reduced strings, so that the blocks storing the reduced strings are accessed only if a matching hash value is found. As described above, in the file-based case, any matching hash value would cause loading of the entire block of reduced strings which corresponds to the matching hash value.

Figure 6:
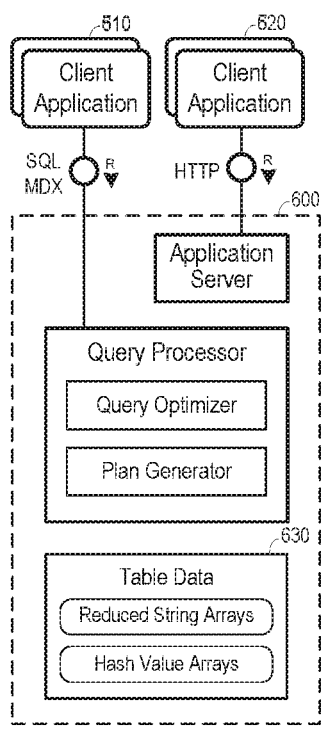
FIG. 6 is a block diagram of a database system using in-memory database storage according to some embodiments.

FIG. 6 illustrates an "in-memory" database, in which the full database stored in volatile (e.g., non-disk-based) memory (e.g., Random Access Memory) 630. The full database may be persisted in and/or backed up to fixed disks (not shown). Elements of the FIG. 6 system may be cloud-based as described above.

In contrast to the file-based scenario, in which an entire block of entries of a hash value array is associated with a respective block of memory storing a portion of an array of reduced strings, each entry of a hash value array stored in memory 630 may be associated (via a pointer) with a particular single entry of the array of reduced strings. Consequently, if a matching hash value is found, its corresponding reduced string (and no other reduced strings) is accessed and used to reconstruct the column value.

Some embodiments may use the hash function hash_function(x)=0. Consequently, and referring to process 200, the k-byte hash of any reduced string is determined at S220 to be 0, and the hash value determined at S230 is (characters 1 through k) XOR 0=characters 1 through k. The stored hash values of the hash value array are therefore simply the first k bytes of each column value (e.g., "Sc" for the value "Schneider").

This hash function advantageously accelerates searches for values such as "Schneider" and also accelerate searches for searches such as col1>"S". However, hash_function(x)=0 presents limitations if column values are not sufficiently random. For example, since all names will start with an uppercase letter, the number of possible hash values for k=1 is 26. Moreover, clustering may occur with respect to more common starting letters (e.g., consonants). These limitations lead to higher false positive rates than provided by a conventional hash function.

Figure 7:
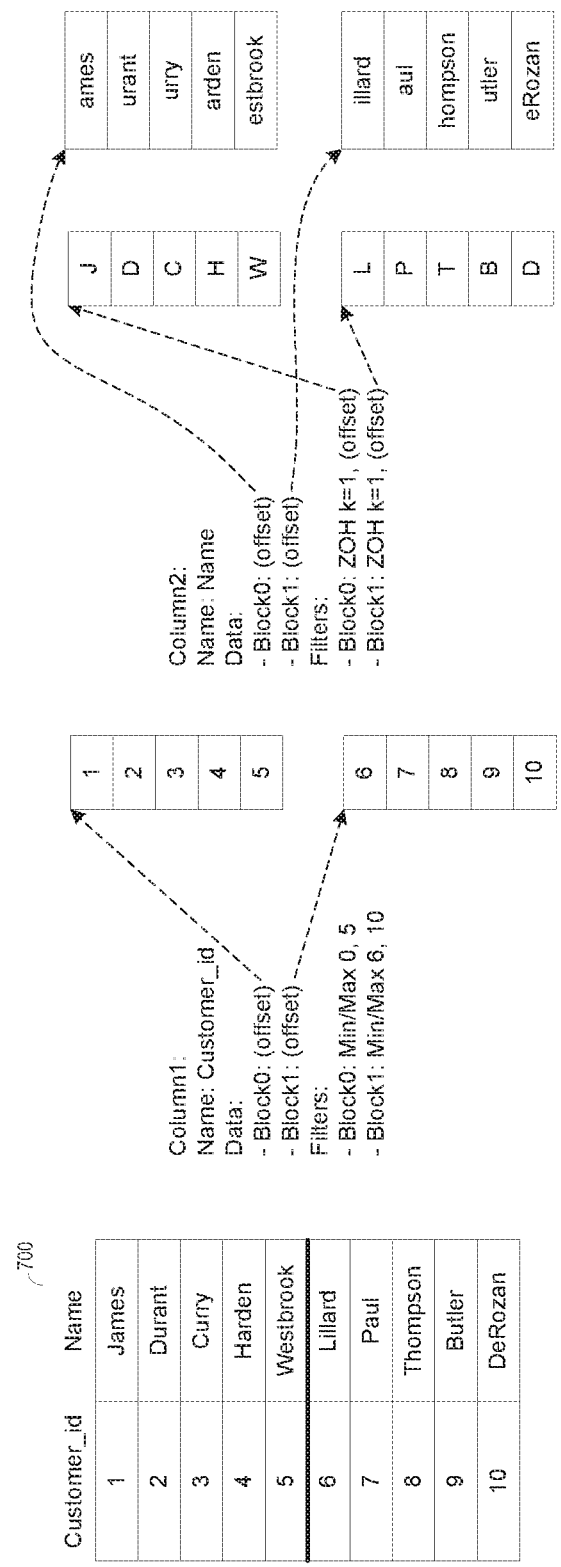
FIG. 7 illustrates representations of two columns of a database table according to some embodiments.

FIG. 7 illustrates storage of columns of a database table according to some embodiments. In the interest of clarity of the accompanying description, one of the columns is stored as described herein, using hash_function(x)=0.

Customers table 700 includes a Customer_id column and a Name column. Storage of Customers table 700 is column-based and based on two defined row groups (Customer_id 1-5 and Customer_id 6-10). FIG. 7 illustrates both in-memory and file-based storage of column values. However, as described above, in-memory storage allows individual access to array entries while access to a file-based array entry requires loading and decompressing a whole block of memory which includes the array entry.

As shown in FIG. 7, the metadata of the first column of table 700 indicates the name of the column and a location (i.e., "offset") of each stored block of values of the column. The "Filters" metadata defines the Min and Max values of each block, enabling a searching algorithm to locate a specific block including a particular value without loading any other block. As described in the Background, such a protocol requires the column to be sequential sorted.

The second column of table 700 is stored in two arrays as described above. Again, the metadata indicates the name of the column and the locations of each block of the reduced string array. The "Filters" metadata indicates the encoding scheme (ZOH) of each block and the value of k used for the encoding. Moreover, the "Filters" metadata indicates (using an offset value) the entries of the hash value array which correspond to each block of the reduced string array. Using such an indication, a particular block to load in response to a particular matching hash value array entry may be determined. In an in-memory case, the memory location of a corresponding reduced string may be calculated based on the offset of the memory block containing the reduced string and the distance of the matching hash value array from its corresponding offset.

Several examples will now be described with respect to FIG. 7. In the first example, it will be assumed that the following query is received: SELECT CUSTOMER_ID, NAME WHERE NAME="Thompson". This query includes no filter on the Customer_id column, but includes the filter="Thompson" on the Name column.

Based on the metadata, it is determined that the Name column is stored using an encoding scheme as described here (i.e., ZOH) and k=1. In view of hash_function(x)=0, a hash value of "T" and a reduced string of "hompson" are determined. Block0 of the hash array is checked for "T". In a file-based case, this check requires loading the hash array for block0 based on the offset specified in the metadata. It is noted that block0 of the hash array does not include "T". Block1 of the hash array is also checked for 'T', by loading the hash array for block if block1 is stored in a file. It is then determined that "T" is the third element in the hash array for block1.

Accordingly, the third element of the reduced string array for block1 ("hompson") is then retrieved. If the reduced string array for block1 is stored in a file, the entire reduced string array for block1 is loaded in order to retrieve the third element. The column value is reconstructed and matched to the filter value. Next, the third element of the block1 data of the Customer_id column (i.e., "13") is retrieved and the retrieved column values are added to the result set: (CUSTOMER_ID: 13, NAME="Thompson")

In a next example, the received query is SELECT CUSTOMER_ID, NAME WHERE NAME="Rousseau". This query includes no filter on the Customer_id column, but includes the filter="Rousseau" on the Name column.

In view of hash_function(x)=0, a hash value of "R" and a reduced string of "ousseau" are determined. Block0 of the hash array is checked for "R" and is determined to not include "R". Similarly, block1 of the hash array is checked for "R" and is determined to not include "R". Since no match was found, the arrays of reduced strings are not checked and the result set is empty.

An example is now considered based on the received query SELECT CUSTOMER_ID, NAME WHERE NAME="Davis". This query includes no filter on the Customer_id column, and includes the filter="Davis" on the Name column.

Based on hash_function(x)=0, a hash value of "D" and a reduced string of "avis" are determined. Block of the hash array is checked for "D" and is determined to include "D" at the first element. Accordingly, the first element of the reduced string array for block0 ("urant") is then retrieved. The column value is reconstructed to "Durant", which is determined to not match "Davis".

Block1 of the hash array is then checked for "D" and is determined to include "D" at the fifth element. The fifth element of the reduced string array for block1 ("eRozan") is retrieved and the column value "DeRozan" is reconstructed therefrom. Since this column value also does not match "Davis", the result set is empty.

A filter as described above may be used in conjunction with filters on table columns which are not encoded as described herein. Such a use is demonstrated in the query SELECT CUSTOMER_ID WHERE NAME="James" AND CUSTOMER_ID>5.

Since the filters are related by the AND operator, it may quickly be determined that the result set is empty if the hash value of the NAME filter is not located in the hash value array. Also, if the hash value is located in the array, query processing may exit before retrieving the corresponding reduced string value if it is determined that the other filter (e.g., CUSTOMER_ID>5) returns an empty set.

Figure 8:
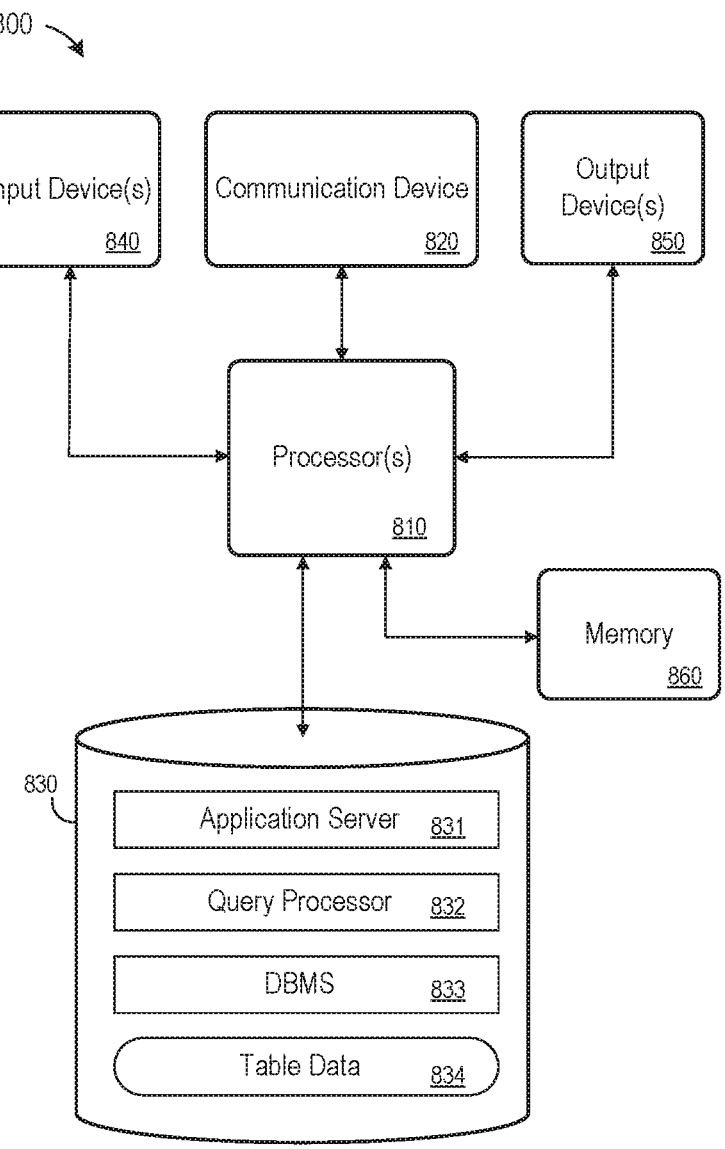
FIG. 8 is a block diagram of a computing system according to some embodiments.

FIG. 8 is a block diagram of server node 800 according to some embodiments. Server node 800 may comprise a general-purpose computing apparatus and may execute program code to perform any of the functions described herein. Server node 800 may comprise an implementation of server node 500 or 600 in some embodiments. Server node 800 may include other unshown elements according to some embodiments.

Server node 800 includes processor(s) 810 operatively coupled to communication device 820, data storage device 830, one or more input devices 840, one or more output devices 850 and memory 860. Communication device 820 may facilitate communication with external devices, such as a client device or a data storage device. Input device(s) 840 may comprise, for example, a keyboard, a keypad, a mouse or other pointing device, a microphone, knob or a switch, an infra-red (IR) port, a docking station, and/or a touch screen. Input device(s) 840 may be used, for example, to enter information into apparatus 800. Output device(s) 850 may comprise, for example, a display (e.g., a display screen) a speaker, and/or a printer.

Data storage device 830 may comprise any appropriate persistent storage device, including combinations of magnetic storage devices (e.g., magnetic tape, hard disk drives and flash memory), optical storage devices, Read Only Memory (ROM) devices, etc., while memory 860 may comprise Random Access Memory (RAM).

Application server 831 and query processor 832 may each comprise program code executed by processor(s) 810 to cause server 800 to perform any one or more of the processes described herein. Embodiments are not limited to execution of these processes by a single computing device.

Table data 834 may include database data as described above. Such data may be indexed and/or encoded as described. Accordingly, table data 834 may comprise hash value arrays and reduced string arrays encoding respective column values. As also described above, such database data (either cached or a full database) may be stored in volatile memory such as volatile memory 860. Data storage device 830 may also store data and other program code for providing additional functionality and/or which are necessary for operation of server 800, such as device drivers, operating system files, etc.

The foregoing diagrams represent logical architectures for describing processes according to some embodiments, and actual implementations may include more or different components arranged in other manners. Other topologies may be used in conjunction with other embodiments. Moreover, each component or device described herein may be implemented by any number of devices in communication via any number of other public and/or private networks. Two or more of such computing devices may be located remote from one another and may communicate with one another via any known manner of network(s) and/or a dedicated connection. Each component or device may comprise any number of hardware and/or software elements suitable to provide the functions described herein as well as any other functions. For example, any computing device used in an implementation some embodiments may include a processor to execute program code such that the computing device operates as described herein.

Embodiments described herein are solely for the purpose of illustration. Those in the art will recognize other embodiments may be practiced with modifications and alterations to that described above.

What is claimed is:

1. A system comprising:
    a memory storing processor-executable program code; and
    a processor to execute the processor-executable program code in order to cause the system to:
        determine a first value of a first row of a database table column;
        generate a first truncated value based on the first value, the first truncated value including fewer bytes than the first value;
        generate a first representation of the first value based on the first value, the first representation including fewer bytes than the first value;
        store the first representation at a first position in a first array; and
        store the first truncated value at a second position in a second array,
        wherein the first position is determined based on a position of the first row, and the second position is determined based on the first position;
        receive a query including at least a request for a given column value;
        determine a value associated with the given column value matches the first representation stored at the first position in the first array;

determine the corresponding first truncated value matches the requested given column value, in a case the value associated with the given column value matches the first representation, and return a result set for the query including at least the given column value.

2. A system according to claim 1, wherein generation of the first represenation comprises:

determination of a first k-byte hash of the first truncated value; and performance of an XOR logical operation between the first k-byte hash and a first k characters of the first value.

3. A system according to claim 2, wherein generation of the first truncated value comprises truncation of the first through kth characters from the first value.

4. A system according to claim 3, the processor to execute the processor-executable program code in order to cause the system to:

receive a filter value;

generate a truncated value of the filter value by truncating the first through kth characters from the filter value;

determine a hash of the truncated value of the filter value;

determine a k-byte filter hash value by performing an XOR logical operation between the hash of the truncated value of the filter value and a first k characters of the filter value;

determine a position of the k-byte filter hash value in the first array;

determine a position of the second array based on the position of the k-byte filter hash value in the first array; and determine whether the filter value matches a truncated value stored at the position of the second array.

5. A system according to claim 1, wherein generation of the first truncated value comprises truncation of the first through kth characters from the first value.

6. A system according to claim 1, the processor to execute the processor-executable program code in order to cause the system to:

receive a filter value;

generate a representation of the filter value;

determine a position of the representation of the filter value in the first array;

determine a position of the second array based on the position of the representation of the filter value in the first array; and determine whether the filter value matches a truncated value stored at the position of the second array.

7. A system according to claim 6, wherein the second array is stored in a plurality of memory blocks of a file-based storage device, wherein determination of the position of the second array comprises determination of one of the plurality of memory blocks, and wherein determination of whether the filter value matches the truncated value stored at the position of the second array comprises loading the one of the plurality of memory blocks.

8. A computer-implemented method, comprising:

determining a first value of a first row of a database table column;

generating a first truncated value based on the first value, the first truncated value including fewer bytes than the first value;

generating a first representation of the first value based on the first truncated value, the first representation including fewer bytes than the first value;

storing the first representation at a first position in a first array; and storing the first truncated value at a second position in a second array, wherein the first position is determined based on a position of the first row, and the second position is determined based on the first position;

receiving a query including at least a request for a given column value;

determining a value assocaited with the given column value matches the first representation stored at the first position in the first array;

determining the corresponding first truncated value matches the requested given column value, in a case the value assocaited with the given column value matches the first representation; and returning a result set for the query including at least the given column value.

9. A method according to claim 8, wherein generating the first represenation comprises:

determining a first k-byte hash of the first truncated value;

performing an XOR logical operation between the first k-byte hash and a first k characters of the first value.

10. A method according to claim 9, wherein generating the first truncated value comprises truncation of the first through kth characters from the first value.

11. A method according to claim 10, further comprising:

receiving a filter value;

generating a truncated value of the filter value by truncating the first through kth characters from the filter value;

determining a hash of the truncated value of the filter value;

determining a k-byte filter hash value by performing an XOR logical operation between the hash of the truncated value of the filter value and a first k characters of the filter value;

determining a position of the k-byte filter hash value in the first array;

determining a position of the second array based on the position of the k-byte filter hash value in the first array; and determining whether the filter value matches a truncated value stored at the position of the second array.

12. A method according to claim 8, wherein generating the first truncated value comprises truncating the first through kth characters from the first value.

13. A method according to claim 8, further comprising:

receiving a filter value;

generating a representation of the filter value;

determining a position of the representation of the filter value in the first array;

determining a position of the second array based on the position of the representation of the filter value in the first array; and determining whether the filter value matches a truncated value stored at the position of the second array.

14. A method according to claim 13, wherein the second array is stored in a plurality of memory blocks of a file-based storage device, wherein determination of the position of the second array comprises determination of one of the plurality of memory blocks, and wherein determination of whether the filter value matches the truncated value stored at the position of the second array comprises loading the one of the plurality of memory blocks.

15. A system comprising:
a database server; and
a data storage system,
wherein the database server is to:
determine a first value of a first row of a database table column;
generate a first truncated value based on the first value, the first truncated value including fewer bytes than the first value;
generate a first representation of the first value based on the first truncated value, the first representation including fewer bytes than the first value;
store the first representation at a first position in a first array of the data storage system;
store the first truncated value at a second position in a second array of the data storage system;
receive a query including at least a request for a given column value;
determine a value assocaited with the given column value matches the first representation stored at the first position in the first array;
determine the corresponding first truncated value matches the requeted given column value, in a case the value assocaited with the given column value matches the first represetnation, and
return a result set for the query including at least the given column value.

16. A system according to claim 15, wherein generation of the first represenation comprises:
determination of a first k-byte hash of the first truncated value;
performance of an XOR logical operation between the first k-byte hash and a first k characters of the first value.

17. A system according to claim 16, wherein generation of the first truncated value comprises truncation of the first through kth characters from the first value.

18. A system according to claim 17, the database server to:
receive a filter value;
generate a truncated value of the filter value by truncating the first through kth characters from the filter value;
determine a hash of the truncated value of the filter value;
determine a k-byte filter hash value by performing an XOR logical operation between the hash of the truncated value of the filter value and a first k characters of the filter value;
determine a position of the k-byte filter hash value in the first array;
determine a position of the second array based on the position of the k-byte filter hash value in the first array; and
determine whether the filter value matches a truncated value stored at the position of the second array.

19. A system according to claim 15, the database server further to:
receive a filter value;
generate a representation of the filter value;
determine a position of the representation of the filter value in the first array;
determine a position of the second array based on the position of the representation of the filter value in the first array; and
determine whether the filter value matches a truncated value stored at the position of the second array.

20. A system according to claim 19, wherein the second array is stored in a plurality of memory blocks of a file-based storage device,
wherein determination of the position of the second array comprises determination of one of the plurality of memory blocks, and
wherein determination of whether the filter value matches the truncated value stored at the position of the second array comprises loading the one of the plurality of memory blocks.

* * * * *